US012652825B2

(12) United States Patent
Uchida

(10) Patent No.: US 12,652,825 B2
(45) Date of Patent: Jun. 9, 2026

(54) SEMICONDUCTOR DEVICE

(71) Applicant: FUJI ELECTRIC CO., LTD.,
Kawasaki (JP)

(72) Inventor: Takafumi Uchida, Matsumoto-city (JP)

(73) Assignee: FUJI ELECTRIC CO., LTD.,
Kawasaki (JP)

( * ) Notice: Subject to any disclaimer, the term of this
patent is extended or adjusted under 35
U.S.C. 154(b) by 438 days.

(21) Appl. No.: 18/477,619

(22) Filed: Sep. 29, 2023

(65) Prior Publication Data

US 2024/0170570 A1 May 23, 2024

(30) Foreign Application Priority Data

Nov. 17, 2022 (JP) ................................. 2022-184284

(51) Int. Cl.
H10D 30/66 (2025.01)
H10D 62/13 (2025.01)
H10D 64/27 (2025.01)

(52) U.S. Cl.
CPC ......... H10D 30/668 (2025.01); H10D 62/155
(2025.01); H10D 64/513 (2025.01); H10D
64/519 (2025.01)

(58) Field of Classification Search
None
See application file for complete search history.

(56) References Cited

U.S. PATENT DOCUMENTS

| | | | | |
|---|---|---|---|---|
| 10,115,793 | B2 * | 10/2018 | Nagata | ................. H10D 12/481 |
| 2007/0040215 | A1 * | 2/2007 | Ma | ........................ H10D 62/127 |
| | | | | 257/E29.136 |
| 2021/0074846 | A1 | 3/2021 | Hoshi | |
| 2021/0226053 | A1 * | 7/2021 | Hoshi | ................. H10D 30/669 |
| 2021/0296492 | A1 | 9/2021 | Kinoshita | |

FOREIGN PATENT DOCUMENTS

| | | |
|---|---|---|
| JP | 2006-344802 A | 12/2006 |
| JP | 2021-044275 A | 3/2021 |
| JP | 2021-150407 A | 9/2021 |

* cited by examiner

*Primary Examiner* — Nishath Yasmeen

(57) ABSTRACT

A semiconductor device includes an active region as a region through which main current flows, an active region perimeter that surrounds the active region, and an edge termination region that surrounds the active region perimeter. The active region perimeter includes: a semiconductor substrate; a drift layer of a first conductivity type; a base region of a second conductivity type provided on an upper surface side of the drift layer; a source region of a first conductivity type selectively provided on an upper surface side of the base region; a perimeter trench including a contact region of the second conductivity type selectively provided, having at least a sidewall on the active region side in contact with the source region, and provided to pass through the base region; and a source ring region provided to be in contact with the contact region.

16 Claims, 8 Drawing Sheets

SEMICONDUCTOR DEVICE

CROSS-REFERENCE TO RELATED APPLICATION(S)

This application is based on and claims priority under 35 USC 119 from Japanese Patent Application No. 2022-184284 filed on Nov. 17, 2022, the contents of which are incorporated herein by reference.

TECHNICAL FIELD

The present invention relates to a semiconductor device.

BACKGROUND ART

Currently, silicon carbide (SiC) is attracting attention as a constitutional material of a power semiconductor device that controls high voltage or large current. Silicon carbide is a chemically stable semiconductor material, has a wide band gap of 3 eV, and can be used extremely stably as a semiconductor even at high temperatures. In addition, since silicon carbide has a maximum electric field strength greater than that of silicon by one or more orders of magnitude, it is expected as a semiconductor material capable of sufficiently reducing an on-resistance. For this reason, a high withstand voltage of a semiconductor device can be ensured using a semiconductor made of silicon carbide.

JP2021-044275A describes a semiconductor device using silicon carbide and including an active region, a gate ring region surrounding the active region, and a source ring region surrounding the gate ring region.

In a semiconductor device such as a MOSFET having a source ring structure, when a gate voltage is applied and current flows as a positive bias between a drain and a source, there is a concern that the current will concentrate in a part of the source ring region. An object is to prevent concentration of the current to make it difficult for destruction to occur.

SUMMARY

In order to solve the above problems, a semiconductor device according to the present invention has following characteristics.

A semiconductor device includes:
a semiconductor substrate having upper and lower surfaces;
a first semiconductor layer of a first conductivity type provided on the upper surface of the semiconductor substrate, and the first semiconductor layer having a lower impurity concentration than that of the semiconductor substrate;
a second semiconductor layer of a second conductivity type provided on an upper surface side of the first semiconductor layer;
a first semiconductor region of the first conductivity type selectively provided in a surface layer on an upper surface side of the second semiconductor layer, and the first semiconductor region having a higher impurity concentration than that of the first semiconductor layer;
an active region including at least a first gate insulating film in contact with the second semiconductor layer, a first gate electrode provided on an upper surface of the first gate insulating film, an interlayer insulating film provided on the first gate electrode, a first electrode in contact with the second semiconductor layer and the first semiconductor region, and a second electrode in contact with the lower surface of the semiconductor substrate; and
an active region perimeter including a perimeter trench and a source ring region, the perimeter trench configured to surround the active region, the perimeter trench provided on the upper surface side of the second semiconductor layer, the perimeter trench configured to penetrate through the second semiconductor layer, and the source ring region configured to surround the perimeter trench, in which the perimeter trench is configured such that a second gate electrode is provided inside the perimeter trench with a second gate insulating film interposed therebetween and is formed immediately below the first electrode.

In addition, in the semiconductor device according to the present invention, regarding the above-described invention, the first semiconductor region of the first conductivity type is provided to be in contact with at least a sidewall of the perimeter trench on the active region side.

Further, in the semiconductor device according to the present invention, regarding the above-described invention, the perimeter trench is selectively provided to surround the active region.

Further, in the semiconductor device according to the present invention, regarding the above-described invention, the second gate electrode in the perimeter trench is connected to the first gate electrode in the active region via an outer peripheral gate wiring.

Further, in the semiconductor device according to the present invention, regarding the above-described invention, the outer peripheral gate wiring is selectively provided to surround the active region.

Further, in the semiconductor device according to the present invention, regarding the above-described invention, the outer peripheral gate wiring is made of polysilicon.

Further, in the semiconductor device according to the present invention, regarding the above-described invention, the source ring region is selectively provided to surround the perimeter trench, and is connected to the first electrode at an arbitrary location.

Further, in the semiconductor device according to the present invention, regarding the above-described invention, a second semiconductor region of a second conductivity type having a higher concentration than that of the second semiconductor layer is provided to cover a bottom surface of the perimeter trench in the active region perimeter.

Further, in the semiconductor device according to the present invention, regarding the above-described invention, the active region includes an active region trench, the first gate insulating film is provided along an inner wall of the active region trench, and the first gate electrode is provided on the first gate insulating film so as to fill the inside of the trench.

According to the invention described above, the source ring region is provided in the active region perimeter so as to surround the active region. The source ring region is electrically connected to the source electrode and has a function of extracting displacement current flowing from an edge termination region into the active region when the semiconductor device is off. In addition, the source ring region can lessen current concentration on a certain location by increasing a connection area with the source electrode. Further, by providing a trench in the active region perimeter and forming a channel around the trench, current concentration on a body diode immediately below the source ring region when the semiconductor device is on is lessened to enable suppression of element destruction.

According to the present invention, it is possible to provide the semiconductor device capable of suppressing destruction of an element by preventing current concentration on the source ring portion during an operation of the semiconductor device.

DESCRIPTION OF EMBODIMENTS

Figure 1:
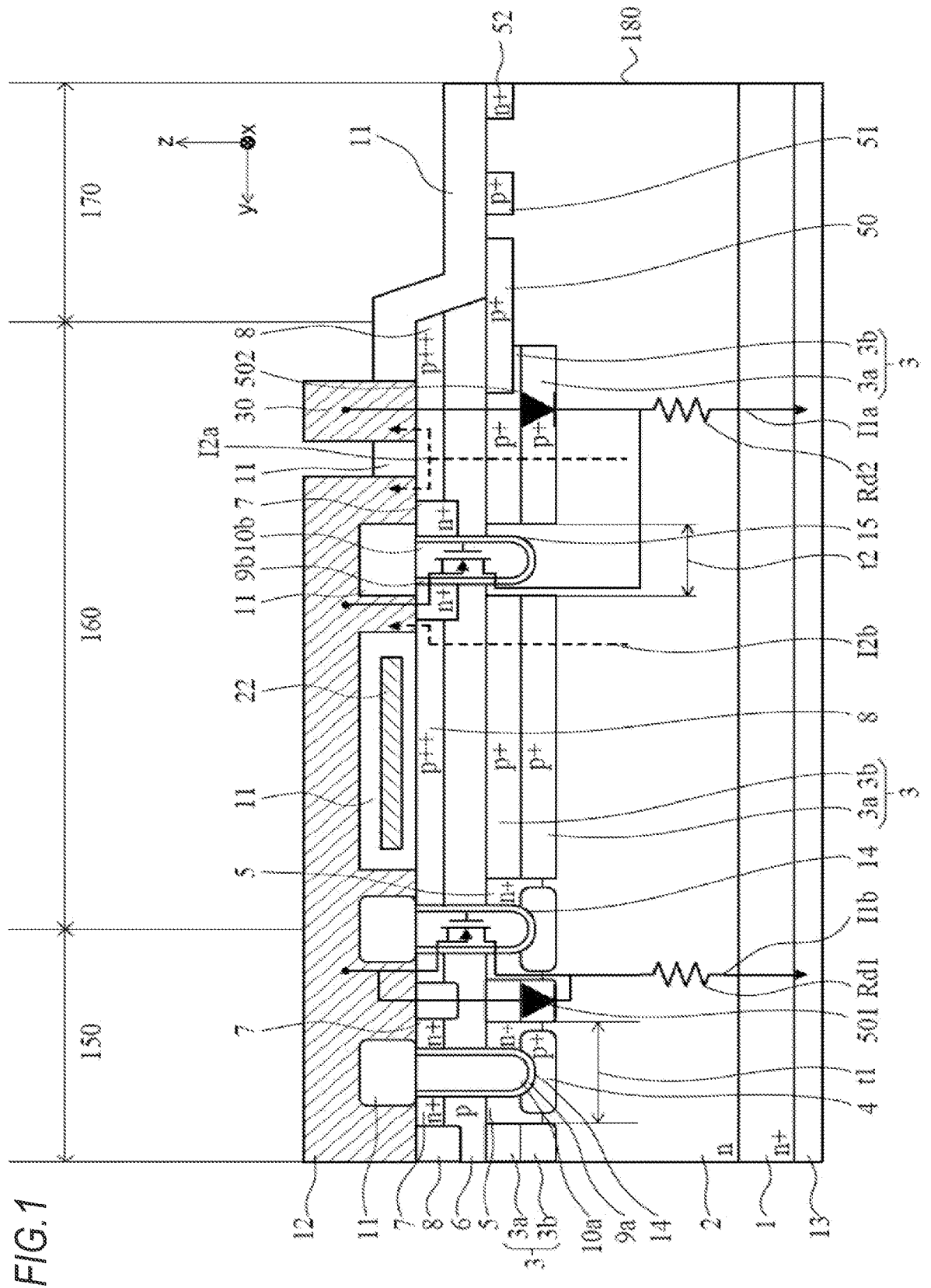
FIG. 1 is a cross-sectional view taken along a line A-A in FIG. 3, showing an example of a semiconductor device according to an embodiment of the present invention.

Hereinafter, preferred embodiments of a semiconductor device according to the present invention will be described with reference to the accompanying drawings. In the specification and accompanying drawings, a layer or region denoted with n or p means that majority carriers of the layer or region are electrons or holes, respectively. In addition, "+" and "−" attached to "n" and "p" mean that impurity concentrations are higher and lower than a layer and a region without "+" and "−", respectively. Cases where denotations of n and p including "+" and "−" are the same indicate that concentrations are close, and therefore, the concentrations are not necessarily equal. Note that, in the description of the embodiments below and the accompanying drawing, the similar configurations are denoted with the same reference numerals, and will not be redundantly described.

As used herein, one side in a direction parallel to a depth direction of a semiconductor substrate is referred to as "upper" and the other side is referred to as "lower." One surface of two principal surfaces of a substrate, a layer or another member is referred to as "upper surface", and the other surface is referred to as "lower surface." The "upper" and "lower" directions are not limited to a gravity direction or a direction at the time of mounting a semiconductor device.

As used herein, orthogonal axes parallel to an upper surface and a lower surface of the semiconductor substrate are defined as the X-axis and the Y-axis. In addition, an axis perpendicular to the upper surface and the lower surface of the semiconductor substrate is defined as the Z-axis. As used herein, the direction of the Z-axis may be referred to as a depth direction. In addition, as used herein, a direction parallel to the upper surface and the lower surface of the semiconductor substrate, including the X-axis and the Y-axis, may be referred to as a horizontal direction.

A region from a center in the depth direction of the semiconductor substrate to the upper surface of the semiconductor substrate may be referred to as the upper surface side. Similarly, a region from the center in the depth direction of the semiconductor substrate to the lower surface of the semiconductor substrate may be referred to as the lower surface side.

As used herein, the description "same" or "equal" may include an error due to manufacturing variation and the like. The error is, for example, within 10%.

Embodiment 1

Figure 2:
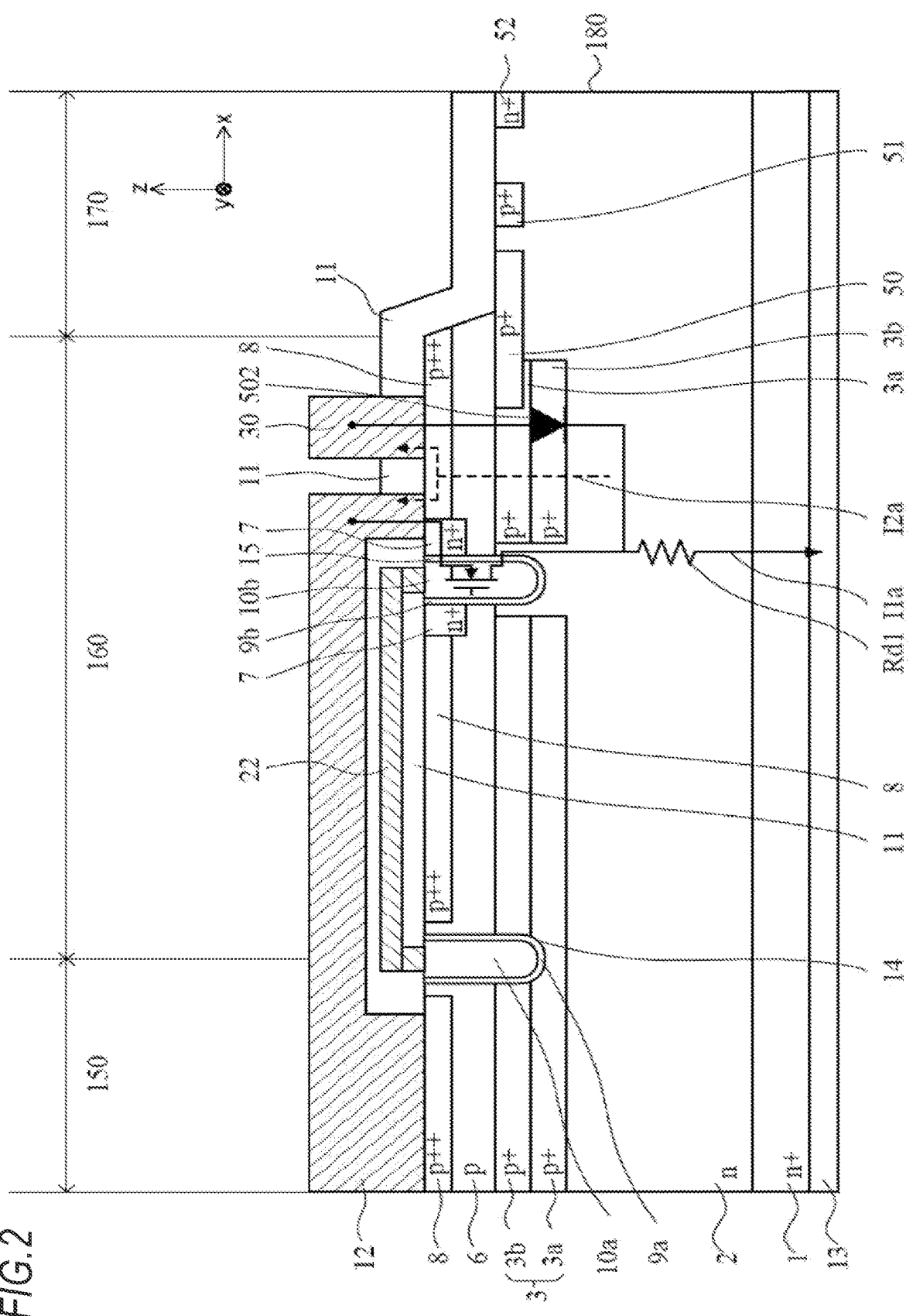
FIG. 2 is a cross-sectional view taken along a line B-B in FIG. 3, showing the example of the semiconductor device according to the embodiment of the present invention.
Figure 3:
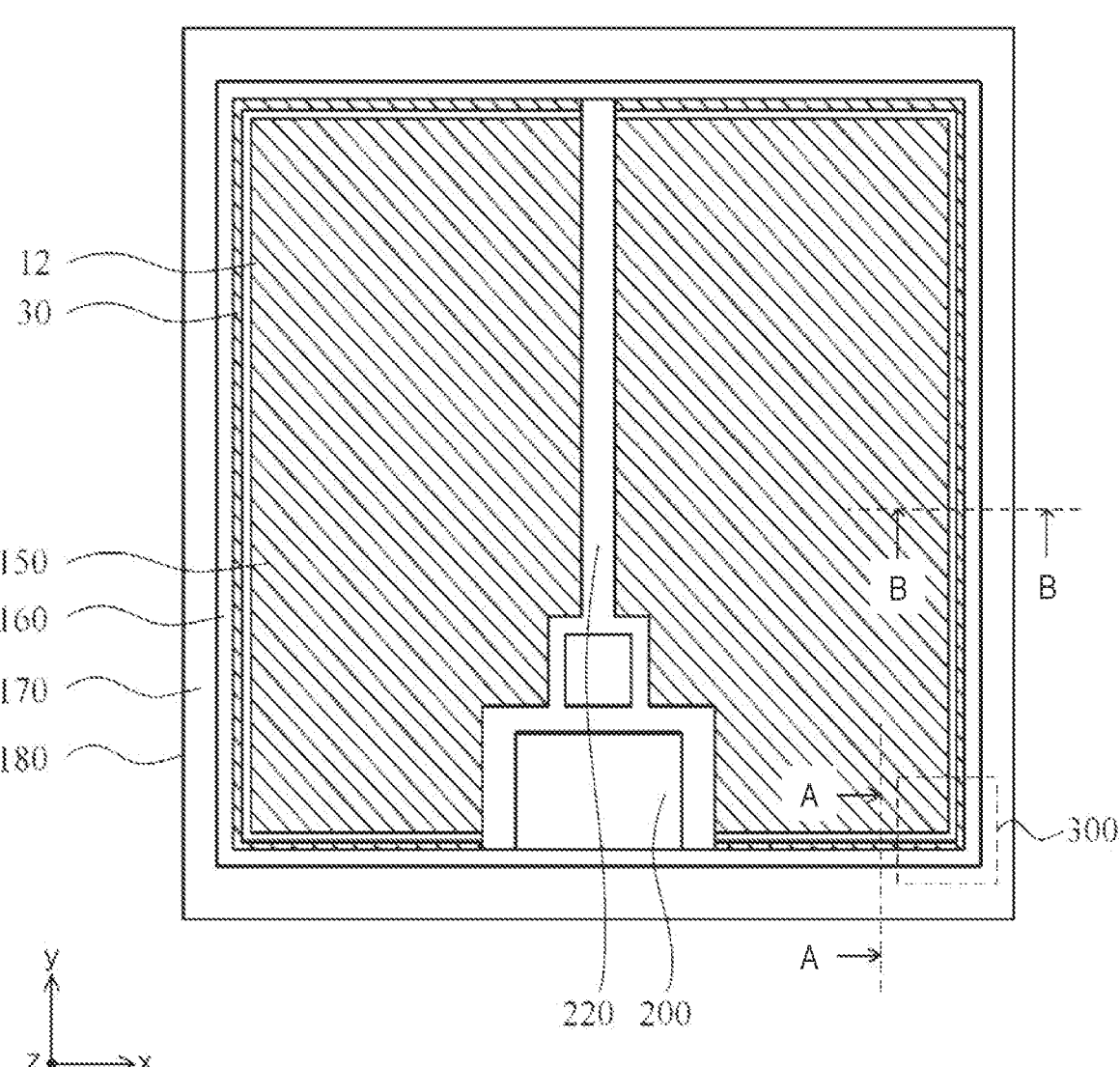
FIG. 3 is a top view of the semiconductor device according to the embodiment of the present invention.

A semiconductor device according to Embodiment 1 is configured using a semiconductor (hereinafter, referred to as a wide bandgap semiconductor) having a wider bandgap than that of silicon (Si). A structure of the semiconductor device according to Embodiment 1 will be described in the case where, for example, silicon carbide (SiC) is used as the wide bandgap semiconductor. A semiconductor device may be made of, instead of silicon carbide (SiC), for example, gallium nitride (GaN), gallium oxide ($Ga_2O_3$), diamond (C), aluminum nitride (AlN) or the like. FIG. 1 is a cross-sectional view of the semiconductor device according to Embodiment 1. FIG. 3 is a plan view of the semiconductor device according to Embodiment 1, and FIG. 1 is a cross-section taken along a line A-A in FIG. 3. In addition, FIG. 2 is a cross-sectional view taken along a line B-B in FIG. 3. In FIG. 1, only two adjacent cells of the semiconductor device are shown in an active region 150, and other cells of the semiconductor device adjacent to a central portion side of the semiconductor substrate are not shown.

The semiconductor device in the present invention includes a semiconductor substrate 1. The semiconductor substrate 1 is a substrate formed of a semiconductor material, and as an example, the semiconductor substrate 1 is a silicon carbide substrate. The semiconductor substrate has an end side 180 in a top view. As used herein, "in a top view" means seeing the semiconductor substrate 1 from the upper surface-side of the semiconductor substrate. The semiconductor substrate 1 of the present example has two sets of end sides 180 facing each other, in a top view. In FIG. 3, the X-axis and the Y-axis are parallel to any one end side 180. In addition, the Z axis is perpendicular to the upper surface of the semiconductor substrate 1.

The semiconductor device includes an n-type drift layer 2 having a lower impurity concentration than that of the semiconductor substrate 1 on the upper surface side of the n-type semiconductor substrate 1. In addition, a drain electrode 13 is provided in a region in contact with the lower surface of the semiconductor substrate 1.

The active region 150 includes, for example, a transistor element such as a metal oxide semiconductor field effect transistor (MOSFET) (insulated gate field effect transistor). The active region 150 is a region through which current flows in the depth direction when the semiconductor device operates, and is surrounded by an active region perimeter 160. A source electrode 12 is provided on the upper surface side of the semiconductor substrate in the active region 150. The source electrode 12 covers the entire surface of the active region 150, for example.

In the semiconductor device, the active region perimeter 160 is provided to surround the active region 150. The active region perimeter 160 is a region that connects the active region 150 and an edge termination region 170, and includes a source ring region 30.

The edge termination region 170 provided between an outer periphery of the active region perimeter 160 and the end side 180 is a region for lessening electric field concentration on the upper surface side to maintain a withstand voltage. In the edge termination region 170, for example, a p-type region constituting a junction termination extension (JTE) structure, a guard ring, a field plate, or a withstand voltage structure such as a RESURF is provided. The withstand voltage is a limit voltage that an element can apply without causing malfunction or destruction.

In FIG. 3, a gate electrode pad 200 of the main semiconductor device, which is a part of a boundary between the active region perimeter 160 and the edge termination region 170 and is separated from the source electrode 12, is provided on the surface of the semiconductor substrate. The semiconductor device may have one or more pads above the semiconductor substrate 1. Each pad is arranged in the vicinity of the end side 180. The vicinity of the end side 180 refers to a region between the end side 180 and the source electrode, in a plan view. In addition, the semiconductor device may include a temperature sensor (not shown) made of polysilicon or the like or a current detector (not shown) provided in the active region 150.

In addition, each pad may be connected to an external circuit through a wiring such as a wire at the time of mounting the semiconductor device.

The gate electrode pad 200 is electrically connected to a perimeter trench 15 (described below) provided in the active region perimeter 160, and to all first gate electrodes 10a in the active region 150 via an outer peripheral gate wiring 22. The perimeter trench 15 is provided in the active region perimeter 160 so as to surround the active region 150.

In addition, the active region perimeter 160 is provided with a source ring region 30 between the source electrode 12 and the edge termination region 170 so as to surround the active region 150. The source ring region 30 is connected to the source electrode 12 at an arbitrary location, and is fixed to a potential (source potential) of the source electrode 12. The source ring region 30 has a function of extracting hole current flowing from the edge termination region 170 into the active region 150 when the semiconductor device is off.

The semiconductor device in FIG. 1 is, for example, a MOSFET having a MOS gate of a trench structure on the upper surface side of the semiconductor substrate. A MOS gate is provided in the active region 150, and the MOS gate includes a p-type base layer 6, an n$^+$-type source region 7, a p$^{++}$-type contact region 8, an active region trench 14, a first gate insulating film 9a, and a first gate electrode 10a.

The active region trench 14 penetrates through the p-type base layer 6 in the depth direction from the upper surface of the semiconductor substrate and reaches an n$^+$-type high-concentration region 5 (n-type drift layer 2 when the n$^+$-type high-concentration region 5 is not provided). In the active region trench 14, the first gate insulating film 9a is provided along an inner wall of the active region trench 14, and the first gate electrode 10a is provided on the first gate insulating film 9a so as to fill an inside of the active region trench 14.

The n$^+$-type high-concentration region 5 may be provided in a surface layer on the upper surface side of the n-type drift layer 2 so as to be in contact with the p-type base layer 6. The n$^+$-type high-concentration region 5 is provided in the horizontal direction so as to cover a sidewall of the active region trench 14, for example.

The n$^+$-type high-concentration region 5 may reach a deeper position on the semiconductor substrate 1 side than a bottom surface of the active region trench 14, from an interface with the p-type base layer 6. Inside the n$^+$-type high-concentration region 5, a first p$^+$-type base region 3 and a second p$^+$-type base region 4 may be selectively provided, respectively. The first p$^+$-type base region 3 is provided between adjacent active region trenches 14, spaced apart from the second p$^+$-type base region 4 and the active region trench 14, and is in contact with the p-type base layer 6. The first p$^+$-type base region 3 may be divided into an upper first p$^+$-type base region 3b and a lower first p$^+$-type base region 3a, in which the impurity concentration and width may be changed, or may be configured as a single region. The second p$^+$-type base region 4 covers at least the bottom surface of the bottom surface and bottom surface corner portions of the active region trench 14. The bottom surface corner portion of the active region trench 14 is a boundary between the bottom surface and the sidewall of the active region trench 14.

Inside the p-type base layer 6, the n$^+$-type source region 7 is selectively provided. The p$^{++}$-type contact region 8 may be selectively provided to be in contact with the n$^+$-type source region 7. The n$^+$-type source region 7 is in contact with the first gate insulating film 9a on the sidewall of the active region trench 14 and faces the first gate electrode 10a via the first gate insulating film 9a on the sidewall of active region trench 14.

The active region trench 14 is provided in plural, spaced apart from each other in a cross-section taken along a line A-A, and intervals of adjacent active region trenches 14 may be the same.

In addition, the interval between adjacent active region trenches 14 may be different from or the same as an interval between the active region trench 14 present at the outermost periphery of the active region and the perimeter trench 15.

Further, in a location where the intervals between the trenches are different, a region from a trench near the active region 150 to the vicinity of the edge termination region 170 may be set as the active region perimeter 160.

Further, in the active region trench 14 provided at the outermost periphery of the active region 150, the n$^+$-type source region 7 may not be provided on the edge termination region side.

Further, a region from a sidewall, in which the n$^+$-type source region 7 is not provided, of the active region trench 14 provided at the outermost periphery of the active region 150 to the vicinity of the edge termination region 170 may be set as the active region perimeter 160.

An interlayer insulating film 11 is provided on the entire upper surface of the semiconductor substrate so as to cover the first gate electrode 10a and a second gate electrode 10b in the active region perimeter 160 described below.

In the active region 150, the source electrode 12 is in ohmic contact with the n$^+$-type source region 7 via a contact hole and is electrically insulated from the first gate electrode 10a by the interlayer insulating film 11. Note that when the p$^{++}$-type contact region 8 is provided, the source electrode 12 is in ohmic contact with the p$^{++}$-type contact region 8.

On a back surface of the semiconductor substrate 1, a back surface electrode 13 serving as a drain electrode is provided. A drain electrode pad (not shown) may be provided on a lower surface side of the back electrode 13.

The gate electrode pad 200 is applied with a gate voltage. The gate electrode pad 200 is electrically connected to the first gate electrode 10a in the active region trench 14 of the active region 150. The semiconductor device may include a gate wiring for connecting the gate electrode pad 200 and the first gate electrode 10*a*.

The gate wiring in this example may have an outer peripheral gate wiring 22. The outer peripheral gate wiring 22 is arranged in the active region perimeter 160 between the active region 150 and the edge termination region 170 in a top view. The outer peripheral gate wiring 22 of this example is selectively provided in the interlayer insulating film 11 on the upper side of the semiconductor substrate 1 so as to surround the active region 150 in a top view. For example, the outer peripheral gate wiring 22 may be formed only in a direction parallel to the Y-axis and may not be provided in the X-axis direction.

All the first gate electrodes 10*a*, and the second gate electrode 10*b* and the outer peripheral gate wiring 22 in the active region perimeter 160, are electrically connected to the gate electrode pad 200.

The semiconductor device may be provided with a gate runner 220 in the active region 150. The gate runner 220 connects the gate electrode pad 200 and the first gate electrode 10*a* in the active region 150. By providing the gate runner 220 in the active region 150, operational variations caused due to a difference in wire length from the gate electrode pad 200 to the first gate electrode 10*a* can be reduced.

The outer peripheral gate wiring 22 and the gate runner 220 may be wirings formed of a semiconductor such as polysilicon doped with impurities or metal wirings made of aluminum or the like.

The semiconductor device includes the edge termination region 170 between the active region perimeter 160 and the end side 180 in a top view. A step is formed on the surface of the semiconductor substrate 1 resulting from the edge termination region 170 formed lower than the active region 150, and the p-type base layer 6 and the n⁺-type source region 7 are removed. In addition, in the edge termination region 170, at least one of a p-type region constituting a junction termination extension (JTE) structure, a guard ring, a field plate, and a structure such as a RESURF may be provided. In this example, a first JTE region 50 and a second JTE region 51 are selectively provided on the upper surface side of the n-type drift layer 2 so as to be in contact with the interlayer insulating film 11, respectively.

The semiconductor device may include the source ring region 30 in a shape surrounding the source electrode 12 on the upper surface side of the semiconductor substrate 1, in the active region perimeter 160. The source ring region 30 may be provided so that a lower surface of the source ring region 30 is in contact with the p⁺⁺-type contact region 8, or in contact with the n⁺-type source region 7.

The source ring region 30 is fixed to the potential (source potential) of the source electrode 12 in the active region 150. The source ring region 30 has a function of extracting, via the p-type base layer 6, hole current flowing from the edge termination region 170 into the active region 150 when the semiconductor device is off. In addition, the source ring region 30 is connected to the source electrode 12 at an arbitrary location (not shown). The source electrode 12 and the source ring region 30 are preferably connected over a wide range of the connection locations in order to prevent current concentration.

In addition, the source ring region 30 may be selectively provided to surround the periphery of the source electrode 12. For example, in FIG. 1, the source ring region 30 may be formed only in a direction parallel to the X axis, and the source ring region 30 may not be provided in a direction perpendicular to the X axis.

The source ring region 30 may be connected to the source electrode 12 in its entire region. For example, the source electrode 12 and the source ring region 30 may be connected by an electrode formed of metal or the like on the upper surface side of the interlayer insulating film 11 between the source electrode 12 and the source ring region 30, or the source electrode 12 may be extended in the direction of the edge termination region 170 and used as the source ring region 30.

In the active region perimeter 160, a perimeter trench 15 is provided on an active region side of the source ring region 30. The perimeter trench 15 is arranged to surround the active region 150. The perimeter trench 15 penetrates through the p-type base layer 6 in the depth direction from the upper surface of the semiconductor substrate and reaches the n⁺-type high-concentration region 5 (n-type drift layer 2 when the n⁺-type high-concentration region 5 is not provided).

Inside the perimeter trench 15, the second gate insulating film 9*b* is provided along an inner wall of the perimeter trench 15, and the second gate electrode 10*b* is configured on the second gate insulating film 9*b* so as to fill an inside of the perimeter trench 15. The second gate electrode 10*b* is covered with the interlayer insulating film 11. The interlayer insulating film 11 is formed with a contact hole penetrating through the interlayer insulating film 11 in the depth direction and reaching the second gate electrode 10*b*, and a gate wiring electrode (not shown) is embedded in the contact hole and electrically connected to the gate electrode pad 200.

The perimeter trench 15 may have the same structure as the active region trench 14 in the active region 150 in the cross-section taken along the A-A line. A length in the depth direction and a width in the horizontal direction of the perimeter trench 15 may be the same as or different from a length in the depth direction and a width in the horizontal direction of the active region trench 14.

In addition, the second p+-type base region 4 provided at least on the bottom surface and at the bottom surface corner portions of the active region trench 14 may also be provided in the perimeter trench 15.

An impurity concentration of the second p⁺-type base region 4 provided in the perimeter trench 15 may be the same as or different from the impurity concentration of the second p⁺-type base region 4 provided in the active region trench 14.

Further, the n⁺-type high-concentration region 5 provided on the side surface of the active region trench 14 may be provided on both side surfaces of the active region trench 14. Further, the n⁺-type high-concentration region 5 may have an interface in contact with the first p⁺-type base region 3, on an opposite side to a surface in contact with the active region trench 14 in the direction parallel to the upper surface of the semiconductor substrate 1. A distance between interfaces facing each other with the active region trench 14 interposed therebetween is denoted as t1. The n⁺-type high-concentration region 5 is a region in which the majority carriers injected from the p-type base layer 6 move by diffusion, and is also called a current spreading region (CSL) that reduces a spreading resistance of the majority carriers.

In the active region perimeter 160, the n-type drift layer 2 adjacent to both sidewalls of the perimeter trench 15 may have an interface with the first p⁺-type base region 3 on an opposite side to a surface in contact with the perimeter trench 15. A distance between interfaces with the n-type drift layer 2 and the first p⁺-type base region 3 facing each other with the perimeter trench 15 interposed therebetween is denoted as t2.

The distance t2 between the interfaces in the active region perimeter 160 may be different from the distance t1 between the interfaces in the active region 150. In the active region perimeter 160, in order to maintain the withstand voltage of the semiconductor device, the distance t2 between the interfaces with the n-type drift layer 2 and the first p⁺-type base region 3 is preferably smaller than the distance t1 between the interfaces with the n⁺-type high-concentration layer 5 and the first p⁺-type base region 3 in the active region 150.

FIG. 2 is a cross-section taken along a line B-B of the semiconductor device according to the present invention. The active region trench 14 has a structure folded back on the active region side of the perimeter trench 15. The cross-section taken along the line B-B shows the structure at a folding-back point.

In the cross-section taken along the line B-B, the perimeter trench 15 may have a structure similar to that of the cross-section taken along the line A-A. In addition, the second gate electrode 10b connected to the gate electrode pad 200 may be connected to all the first gate electrodes 10a via the outer peripheral gate wiring 22.

When the semiconductor device is on, the current flows from the source electrode 12 toward the drain electrode 13 in a pn junction formed in the p⁺⁺-type contact region 8 and the n-type source region 7 on the active region side and in a channel formed by the second gate electrode 10b inside the perimeter trench 15. This path of current is shown in FIGS. 1 and 2 as a current path I1a at gate positive bias on the perimeter side and a current path I1b at gate positive bias on the active region side.

As shown in FIG. 1, the perimeter trench 15 is provided and the channel is formed around the perimeter trench 15, so that activation of a body diode 502 formed by the p⁺-type contact region 3 immediately below the source ring region 30 and the n-type drift region 2 is suppressed, and therefore, destruction of the semiconductor device can be prevented.

In FIGS. 1 and 2, a current path I2a at gate negative bias on the perimeter side and a current path I2b at gate negative bias on the active region side are indicated by dotted lines. In the current path I2a at gate negative bias on the perimeter side, the displacement current flowing from the edge termination region into the active region when the semiconductor device is off concentrates on the source ring region 30.

However, the structure in which the connection area between the source ring region 30 and the source electrode 12 is increased makes it possible to suppress the current from concentrating on the perimeter at the gate negative bias at the connection location between the source ring region 30 and the source electrode 12.

In addition, the first p⁺-type base region 3 in contact with the sidewall, near the edge termination region 170, of the perimeter trench 15 is additionally provided, so that the current concentration on the source ring region 30 can be further suppressed without forming a channel passing through the sidewall of the perimeter trench 15 from the source ring region 30 when the semiconductor device is on.

Figure 4:
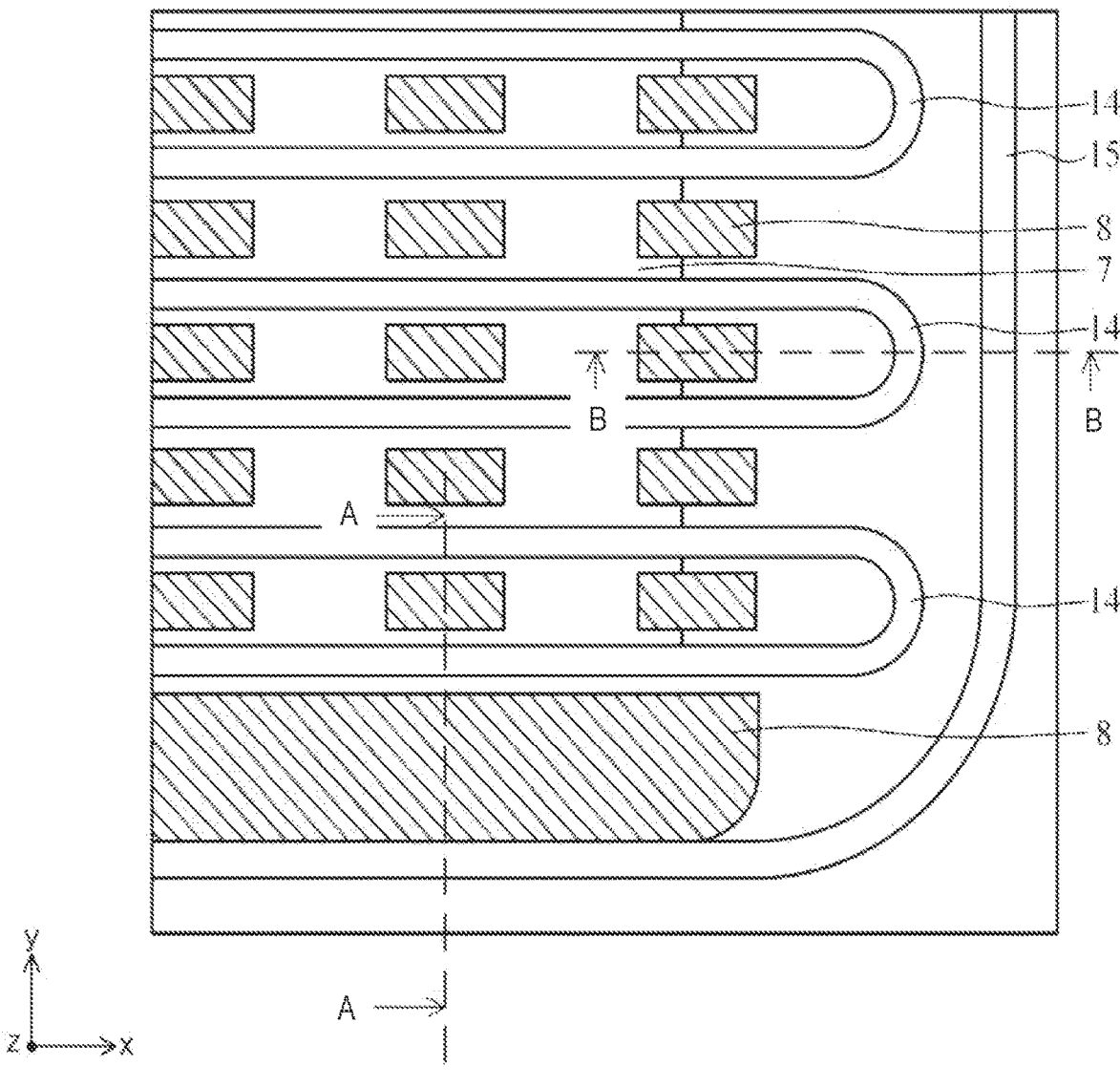
FIG. 4 is an enlarged top view of the semiconductor device according to the embodiment of the present invention.

FIG. 4 is an enlarged top view of a portion surrounded by the dotted line 300 in FIG. 3. The active region trenches 14 in the active region 150 are formed spaced apart from each other, and may have a folded-back shape by connecting adjacent trenches at ends in a trench longitudinal direction. The active region trench 14 may have a linear (stripe) planar pattern extending parallel to the X-axis direction in FIG. 1. A line A-A in FIG. 4 corresponds to FIG. 1 and a line B-B corresponds to FIG. 2.

Figure 5:
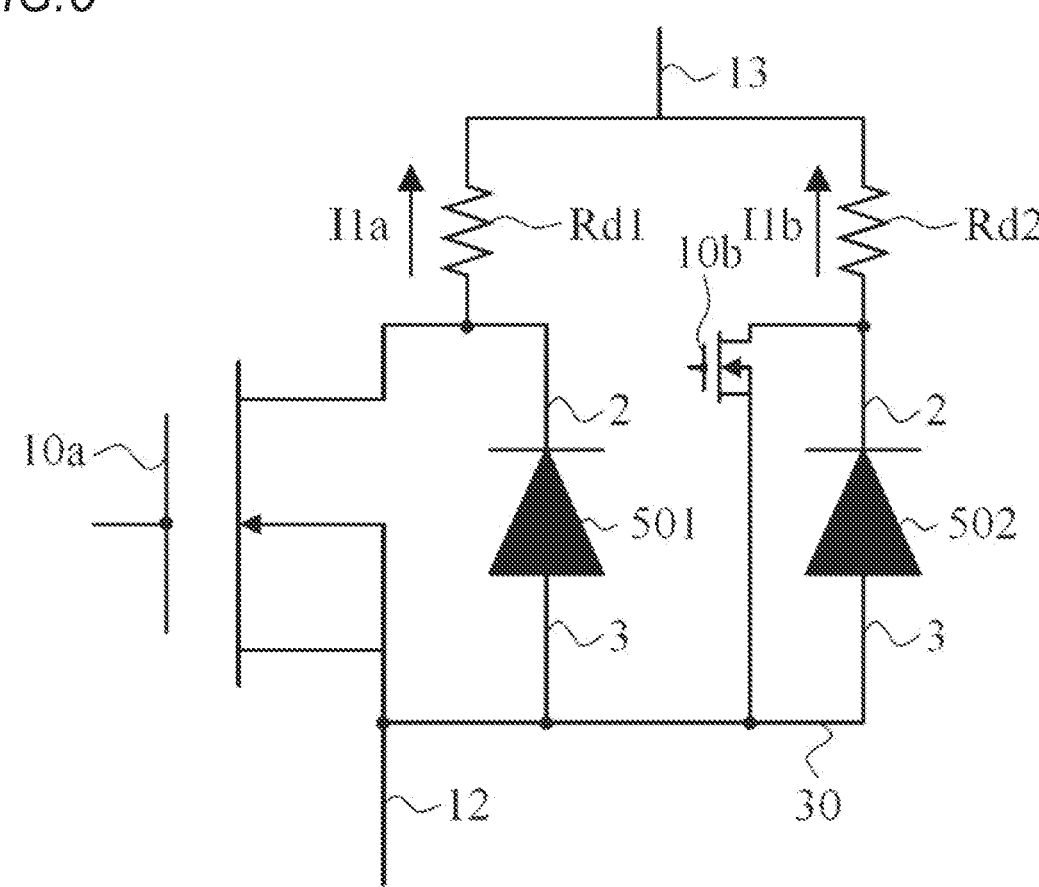
FIG. 5 is an equivalent circuit diagram of the semiconductor device when a positive bias is applied in the present invention.

FIG. 5 is an equivalent circuit diagram when the semiconductor device according to the present invention is on. When the semiconductor device is on, the current I1a flows from the source electrode 12 toward the drain electrode 13 via the pn junction formed in the p⁺⁺-type contact region 8 and the n-type source region 7 of the active region 150, the channel formed by the first gate electrode 10a inside the active region trench 14, and the active region-side body diode 501 formed by the first p⁺-type base region 3 and the n-type drift layer 2. In addition, in the active region perimeter, the current I1b flows from the source electrode 12 toward the drain electrode 13 via the channel formed by the electrode 10b and the body diode 502 formed between the first p⁺-type base region 3 immediately below the source ring region 30 and the n-type drift layer 2. By forming the channel in the active region perimeter, current flowing through the active region perimeter-side body diode 502 formed by the p⁺-type contact region 3 immediately below the source ring and the n-type drift region 2 can be suppressed.

Figure 6:
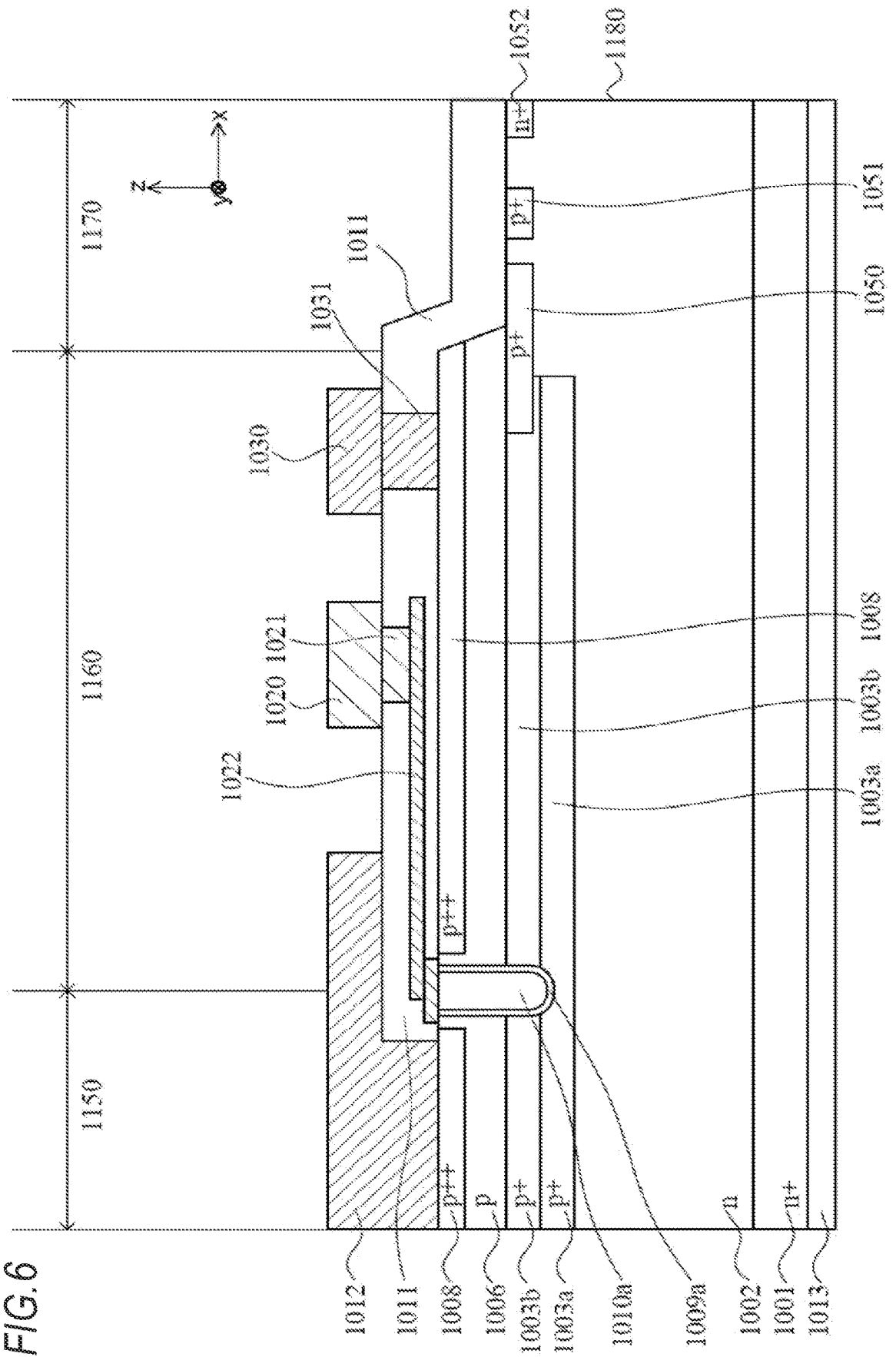
FIG. 6 is a cross-sectional view taken along a line A-A in FIG. 8, showing a structure of a semiconductor device of Comparative Example.
Figure 7:
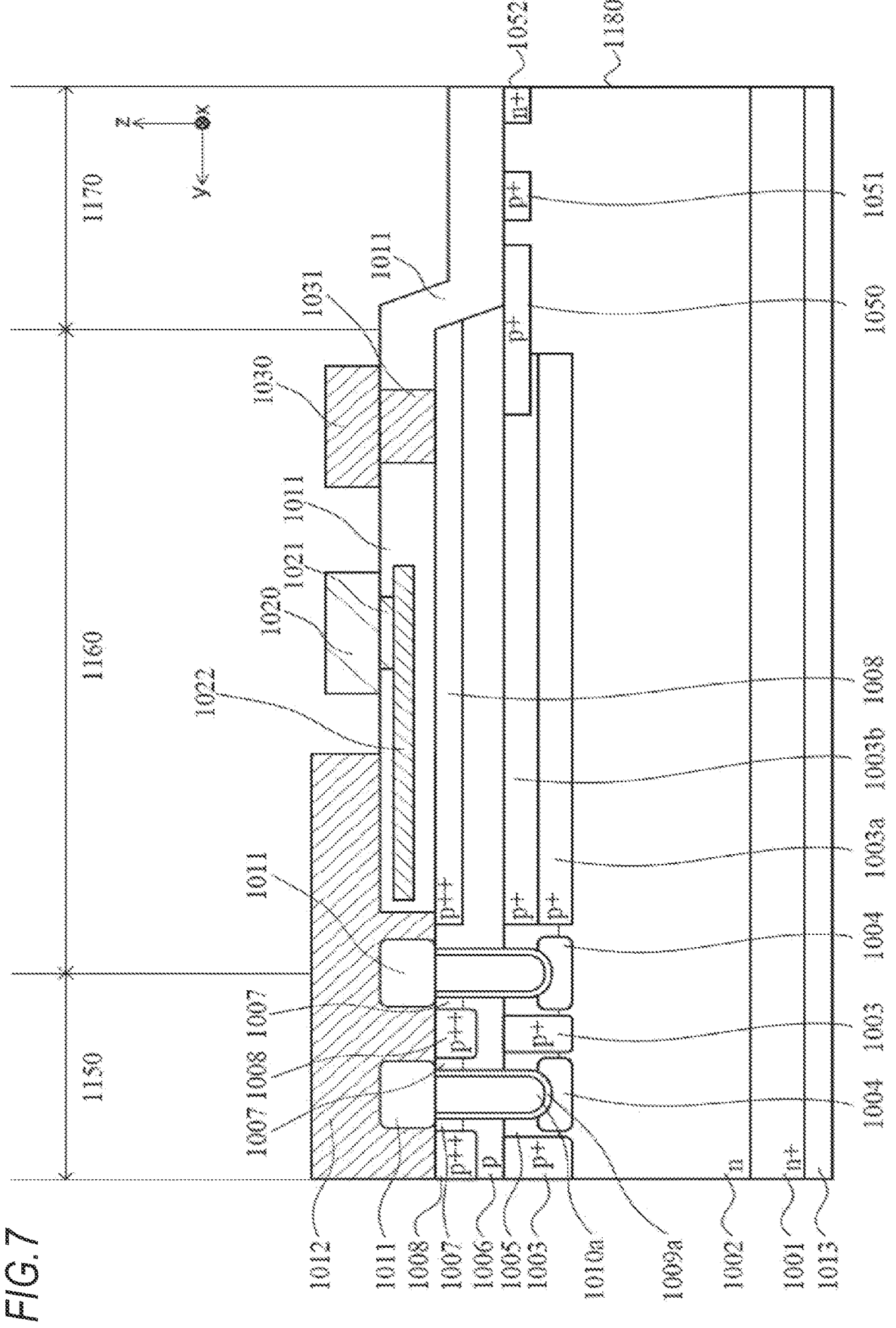
FIG. 7 is a cross-sectional view taken along a line B-B in FIG. 8, showing the structure of the semiconductor device of Comparative Example.
Figure 8:
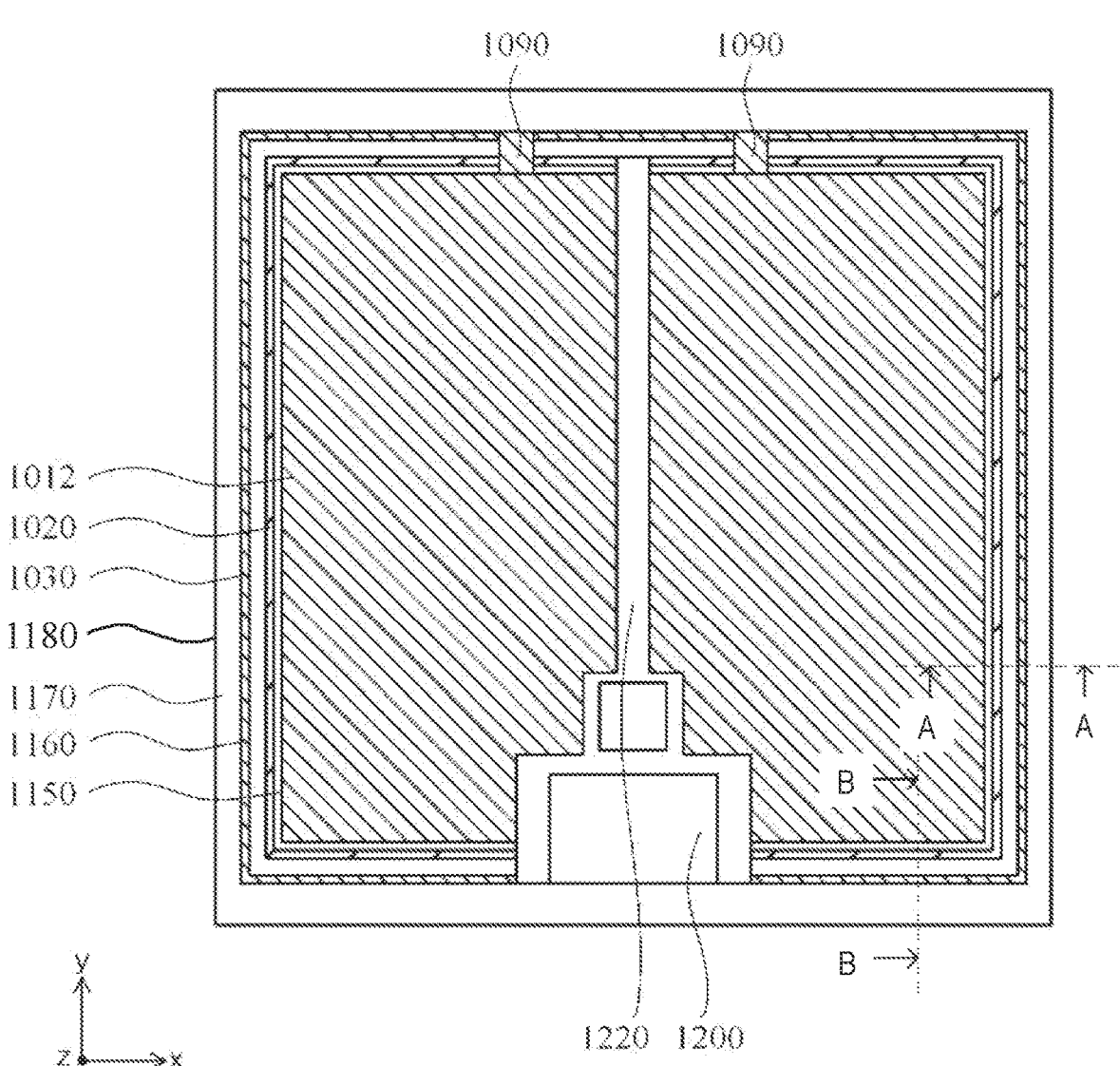
FIG. 8 is a top view showing the structure of the semiconductor device of Comparative Example.

FIGS. 6, 7 and 8 show a structure as Comparative Example. In addition, an operation of Comparative Example will be described while including the equivalent circuit diagram shown in FIG. 5 when the semiconductor device according to the present invention is on. Note that the structure described in the prior literature, that is JP2021-044275A, has a structure similar to that of the semiconductor device according to the present invention with respect to an active region 1150 and an edge termination region 1170.

An active region perimeter 1160 includes a gate ring region 1020 and a source ring region 1030 on an upper surface side of a semiconductor substrate 1001. The gate ring region 1020 is provided to surround an active region 1150 and is electrically connected to all first gate electrodes 1010a in the active region 1150 via an outer peripheral gate wiring 1022.

In the active region 1150, a gate runner 1220 is provided on the upper surface side of the semiconductor substrate 1001. The gate runner 1220 is connected to all the first gate electrodes 1010a through a gate wiring (not shown).

In addition, the gate ring region 1020 and the gate runner 1220 are electrically connected to a gate electrode pad 1200 provided between a source electrode 1012 on the upper surface side of the semiconductor substrate 1001 and an end side 1180.

The source ring region 1030 is provided to surround the gate ring region 1020. The source ring region 1030 is connected to a p⁺⁺-type contact layer 1008 via a contact metal 1031.

Regarding a connection location between the source electrode 1012 and the source ring region 1030, a source electrode connection region 1090 is provided on the end side 1180-side opposite to the nearest end side 1180 where the gate electrode pad 1200 is arranged. In the structure of Comparative Example, the gate ring region 1020 is provided between the source ring region 1030 and the source electrode 1012, and the location where the source electrode and the source ring are connected is limited to the source electrode connection region 1090. For this reason, when the semiconductor device is off, current may concentrate in the source electrode connection region 1090 formed between the source ring region 1030 and the source electrode 1012, causing destruction.

In addition, in the semiconductor device of Comparative Example, when the semiconductor device is on, the active region perimeter-side body diode 502 formed by the first p$^+$-type base layer 1003 immediately below the source ring and the n-type drift layer 1002 in the active region perimeter 1160 may be more easily activated than the active region-side body diode 501 formed between the first p$^+$-type base region 1003 immediately below the p$^{++}$-type contact region 1008 and the n-type drift region 1002 in the active region 1150.

For this reason, in the semiconductor device of Comparative Example, in the case where the active region perimeter-side body diode 502 is activated when the semiconductor device is on, current may concentrate in the source electrode connection region 1090, which is a connection location of the source electrode 1012 and the source ring region 1030, thereby causing destruction of the device.

According to the semiconductor device of the present invention, the perimeter trench is provided in the active region perimeter 160, the channel is formed around the perimeter trench, and the current path is provided between the source and the drain, so that the current concentration on the source ring region 30 when the semiconductor device is on can be lessened. In addition, the source ring region 30 can be connected to the source electrode 12 at an arbitrary location, and increases the connection area, so that it is possible to lessen the concentration of the displacement current, which flows from the edge terminal region into the active region when the semiconductor device is off, on a certain location, thereby suppressing destruction of the semiconductor device.

Although the MOSFET has been exemplified as the semiconductor device according to the embodiment, the present embodiment can also be applied to an insulated gate bipolar transistor (IGBT) having a configuration in which the n$^+$-type drain region 2 of the MOSFET shown in FIGS. 1 and 2 is set as a p$^+$-type collector region. As the IGBT, in addition to an IGBT single body, a reverse conducting IGBT (RC-IGBT) and a reverse blocking insulated gate bipolar transistor (RB-IGBT) are also applicable.

INDUSTRIAL APPLICABILITY

As described above, the semiconductor device according to the present invention is useful for power semiconductor devices used in power conversion devices, power supply devices, and the like used in industrial machines, automobiles, and the like.

The invention claimed is:

1. A semiconductor device comprising:
a semiconductor substrate having upper and lower surfaces;
a first semiconductor layer of a first conductivity type provided on the upper surface of the semiconductor substrate, and the first semiconductor layer having a lower impurity concentration than that of the semiconductor substrate;
a second semiconductor layer of a second conductivity type provided on an upper surface side of the first semiconductor layer;
a first semiconductor region of the first conductivity type selectively provided in a surface layer on an upper surface side of the second semiconductor layer, and the first semiconductor region having a higher impurity concentration than that of the first semiconductor layer;
an active region including at least a first gate insulating film in contact with the second semiconductor layer, a first gate electrode provided on an upper surface of the first gate insulating film, an interlayer insulating film provided on the first gate electrode, a first electrode in contact with the second semiconductor layer and the first semiconductor region, and a second electrode in contact with the lower surface of the semiconductor substrate; and
an active region perimeter including a perimeter trench and a source ring region, the perimeter trench configured to surround the active region, the perimeter trench provided on the upper surface side of the second semiconductor layer, the perimeter trench configured to penetrate through the second semiconductor layer, and the source ring region configured to surround the perimeter trench, wherein
the perimeter trench is configured such that a second gate electrode is provided inside the perimeter trench with a second gate insulating film interposed therebetween and is formed immediately below the first electrode.

2. The semiconductor device according to claim 1, wherein in the active region perimeter, the first semiconductor region of the first conductivity type is provided to be in contact with at least a sidewall of the perimeter trench on the active region side.

3. The semiconductor device according to claim 1, wherein the perimeter trench is selectively provided to surround the active region.

4. The semiconductor device according to claim 2, wherein the perimeter trench is selectively provided to surround the active region.

5. The semiconductor device according to claim 1, wherein the second gate electrode in the perimeter trench is connected to the first gate electrode in the active region via an outer peripheral gate wiring.

6. The semiconductor device according to claim 2, wherein the second gate electrode in the perimeter trench is connected to the first gate electrode in the active region via an outer peripheral gate wiring.

7. The semiconductor device according to claim 5, wherein the outer peripheral gate wiring is selectively provided to surround the active region.

8. The semiconductor device according to claim 6, wherein the outer peripheral gate wiring is selectively provided to surround the active region.

9. The semiconductor device according to claim 7, wherein the outer peripheral gate wiring is made of polysilicon.

10. The semiconductor device according to claim 8, wherein the outer peripheral gate wiring is made of polysilicon.

11. The semiconductor device according to claim 1, wherein the source ring region is selectively provided to surround the perimeter trench and is connected to the first electrode at an arbitrary location.

12. The semiconductor device according to claim 2, wherein the source ring region is selectively provided to surround the perimeter trench and is connected to the first electrode at an arbitrary location.

13. The semiconductor device according to claim 1, wherein in the perimeter trench, a second semiconductor region of a second conductivity type having a higher concentration than that of the second semiconductor layer is provided to cover a bottom surface of the perimeter trench.

14. The semiconductor device according to claim 2, wherein in the perimeter trench, a second semiconductor region of a second conductivity type having a higher concentration than that of the second semiconductor layer is provided to cover a bottom surface of the perimeter trench.

15. The semiconductor device according to claim 1, wherein the active region comprises an active region trench, the first gate insulating film is provided along an inner wall of the active region trench, and the first gate electrode is provided on the first gate insulating film so as to fill the inside of the trench.

16. The semiconductor device according to claim 2, wherein the active region comprises an active region trench, the first gate insulating film is provided along an inner wall of the active region trench, and the first gate electrode is provided on the first gate insulating film so as to fill the inside of the trench.

\* \* \* \* \*